United States Patent
Ishizuka et al.

(10) Patent No.: US 7,695,763 B2
(45) Date of Patent: Apr. 13, 2010

(54) METHOD FOR CLEANING PROCESS CHAMBER OF SUBSTRATE PROCESSING APPARATUS, SUBSTRATE PROCESSING APPARATUS, AND METHOD FOR PROCESSING SUBSTRATE

(75) Inventors: Shuuichi Ishizuka, Nirasaki (JP); Masaru Sasaki, Amagasaki (JP); Tetsuro Takahashi, Nirasaki (JP); Koji Maekawa, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 491 days.

(21) Appl. No.: 10/587,394

(22) PCT Filed: Jan. 27, 2005

(86) PCT No.: PCT/JP2005/001057

§ 371 (c)(1), (2), (4) Date: Jul. 27, 2006

(87) PCT Pub. No.: WO2005/074016

PCT Pub. Date: Aug. 11, 2005

(65) Prior Publication Data

US 2007/0181145 A1 Aug. 9, 2007

(30) Foreign Application Priority Data

Jan. 28, 2004 (JP) .............................. 2004-020157

(51) Int. Cl.
C23C 16/00 (2006.01)
B08B 6/00 (2006.01)
B08B 9/00 (2006.01)

(52) U.S. Cl. ................. 427/248.1; 134/22.1; 134/22.18; 134/26; 134/30; 134/34; 134/37; 134/42

(58) Field of Classification Search ....................... None
See application file for complete search history.

(56) References Cited

U.S. PATENT DOCUMENTS 4,960,488 A * 10/1990 Law et al. .................... 438/694

(Continued)

FOREIGN PATENT DOCUMENTS

JP      09 232299      9/1997

(Continued)

Primary Examiner—Timothy H Meeks
Assistant Examiner—Joseph Miller, Jr.
(74) Attorney, Agent, or Firm—Oblon, Spivak, McClelland, Maier & Neustadt, L.L.P.

(57) ABSTRACT

In a substrate processing apparatus configured to perform a predetermined process on a target substrate accommodated in a process chamber, the process chamber is cleaned by alternately performing an operation of generating plasma of a gas containing oxygen within the process chamber, and an operation of generating plasma of a gas containing nitrogen within the process chamber.

14 Claims, 7 Drawing Sheets

U.S. PATENT DOCUMENTS

| | | | |
|---|---|---|---|
| 5,176,791 A * | 1/1993 | Itoh et al. | 216/81 |
| 5,454,903 A * | 10/1995 | Redeker et al. | 134/1.1 |
| 6,068,729 A * | 5/2000 | Shrotriya | 156/345.26 |
| 2001/0001175 A1* | 5/2001 | Narwankar et al. | 118/300 |
| 2001/0017190 A1* | 8/2001 | Nakaune et al. | 156/345 |
| 2002/0033183 A1* | 3/2002 | Sun et al. | 134/1.1 |
| 2002/0045966 A1* | 4/2002 | Lee et al. | 700/121 |
| 2002/0073922 A1* | 6/2002 | Frankel et al. | 118/715 |
| 2003/0047140 A1* | 3/2003 | Bailey, III | 118/723 ME |
| 2003/0226822 A1* | 12/2003 | Li et al. | 216/63 |
| 2004/0000321 A1* | 1/2004 | Cui et al. | 134/1.2 |
| 2004/0077511 A1* | 4/2004 | Barnes et al. | 510/175 |
| 2004/0084409 A1* | 5/2004 | Deshmukh et al. | 216/63 |
| 2005/0133059 A1* | 6/2005 | Chen et al. | 134/1.1 |

FOREIGN PATENT DOCUMENTS

| | | |
|---|---|---|
| JP | 10 154706 | 6/1998 |
| JP | 10 233387 | 9/1998 |
| JP | 11 003878 | 1/1999 |
| JP | 2000 294550 | 10/2000 |
| JP | 2002 353206 | 12/2002 |
| JP | 2003 183839 | 7/2003 |
| JP | 2004 335789 | 11/2004 |
| JP | 2005 085956 | 3/2005 |

* cited by examiner

METHOD FOR CLEANING PROCESS CHAMBER OF SUBSTRATE PROCESSING APPARATUS, SUBSTRATE PROCESSING APPARATUS, AND METHOD FOR PROCESSING SUBSTRATE

TECHNICAL FIELD

The present invention relates to a process chamber cleaning method in a substrate processing apparatus; a substrate processing apparatus; and a substrate processing method, all of which are utilized in e.g., the process of manufacturing semiconductor devices.

BACKGROUND ART

For example, with an increase in miniaturization of the circuit structures of semiconductor devices, substrate processing apparatuses used for manufacturing processes of semiconductor devices have been required even more to set their process chambers for accommodating semiconductor substrates to have very high cleanliness.

Under the circumstances, for example, Patent Document 1 discloses a technique in which a silicon crystal body is placed inside a process chamber at a region to face plasma. Contaminants are deposited on the surface of the silicon crystal body and can be easily removed by acid solution cleaning, thereby increasing the cleanliness of an area to be exposed to plasma within the process chamber.

Further, Patent Document 2 discloses a technique in which a cleaning gas comprising a nitrogen-containing compound and a fluorine-containing compound is supplied into the process chamber of a deposition apparatus and plasma is generated. Consequently, residual substances present within the process chamber are changed into volatile products and thereby removed.

Furthermore, Patent Document 3 discloses a technique in which a gas is supplied into a process chamber and turned into plasma. This plasma is used for performing sputter etching to remove contaminants from a ceramic member disposed inside the process chamber.

However, according to the conventional techniques described above, it has become difficult to meet cleanliness required in recent years, because of the following reasons. Specifically, the interior of a process chamber suffers corrosion of metal members due to corrosive gas, such as a fluorine-containing compound. Alternatively, the interior of a process chamber suffers damage of members disposed therein due to sputtering or re-deposition of sputtered contaminants.

For example, a step of forming gate oxide films in semiconductor devices is important, because this step has a decisive influence on the characteristic of transistors. Since metal contaminants, such as iron (Fe) and copper (Cu), greatly and adversely affect the characteristic of transistors, it is required to provide a decontamination technique that can attain higher cleanliness than the conventional technique.

On the other hand, as another process chamber cleaning method, the process chamber may be opened to the atmosphere and subjected to a wiping treatment with purified water or solvent. However, where a high level of cleanliness is required, as described above, the cleanliness may rather be lowered and unsatisfactory due to contaminants carried into the process chamber opened to the atmosphere. Further, in order to set the process chamber opened to the atmosphere, it is necessary to perform operations of disassembling and reassembling the process chamber, which are troublesome and take a long time. This brings about a technical problem such that the operation ratio of the substrate processing apparatus is significantly decreased.

[Patent Document 1] Jpn. Pat. Appln. KOKAI Publication No. 2002-353206

[Patent Document 2] Jpn. Pat. Appln. KOKAI Publication No. 9-232299

[Patent Document 3] Jpn. Pat. Appln. KOKAI Publication No. 11-3878

DISCLOSURE OF INVENTION

An object of the present invention is to provide a process chamber cleaning method in a substrate processing apparatus, which can swiftly clean the process chamber to be used for accommodating a target substrate, without lowering the operation ratio of the substrate processing apparatus.

Another object of the present invention is to provide a process chamber cleaning method in a substrate processing apparatus, which can clean the process chamber to be used for accommodating a target substrate relatively in a short time to a level necessary for a substrate process to be performed, even where the contamination degree inside the process chamber is relatively high, such as when a plasma processing apparatus is initially set up.

An alternative object of the present invention is to provide a process chamber cleaning method in a substrate processing apparatus, which does not cause corrosion of the interior of the process chamber due to a corrosive substance being used.

A further alternative object of the present invention is to provide a process chamber cleaning method in a substrate processing apparatus, which can clean the interior of the process chamber without causing contamination due to sputtering or re-deposition of contaminants.

A further alternative object of the present invention is to provide a substrate processing apparatus, which can be subjected to such process chamber cleaning, as described above.

A further alternative object of the present invention is to provide a substrate processing method, which includes a step of process chamber cleaning, as described above.

According to a first aspect of the present invention, there is provided a process chamber cleaning method in a substrate processing apparatus configured to perform a predetermined process on a target substrate accommodated in a process chamber, the method comprising:

at least one cycle of alternately performing an operation of generating plasma of a gas containing oxygen within the process chamber, and an operation of generating plasma of a gas containing nitrogen within the process chamber.

According to a second aspect of the present invention, there is provided a computer readable storage medium containing software used for a substrate processing apparatus configured to perform a predetermined process on a target substrate accommodated in a process chamber, wherein the software, when executed by a computer, controls the apparatus to clean the process chamber by alternately performing an operation of generating plasma of a gas containing oxygen within the process chamber, and an operation of generating plasma of a gas containing nitrogen within the process chamber.

According to a third aspect of the present invention, there is provided a substrate processing apparatus comprising: a process chamber configured to accommodate a target substrate; a processing mechanism configured to perform a predetermined process on the target substrate within the process chamber; a plasma generation mechanism configured to generate plasma within the process chamber to clean an interior of the process chamber; and a control mechanism configured to control the plasma generation mechanism, wherein the control mechanism controls the plasma generation mechanism to clean the process chamber by at least one cycle of alternately performing an operation of generating plasma of a gas containing oxygen within the process chamber, and an operation of generating plasma of a gas containing nitrogen within the process chamber.

According to a fourth aspect of the present invention, there is provided a substrate processing method comprising: cleaning a process chamber by at least one cycle of alternately performing an operation of generating plasma of a gas containing oxygen within the process chamber, and an operation of generating plasma of a gas containing nitrogen within the process chamber; then, seasoning the process chamber by at least one operation of generating plasma of a gas containing oxygen or generating plasma of a gas containing nitrogen within the process chamber; and then, installing a target substrate into the process chamber and performing a predetermined process on the target substrate.

According to the present invention, a process chamber cleaning process is executed by alternately generating oxygen plasma and nitrogen plasma within the process chamber in-situ, when a processing apparatus for performing a predetermined process on a substrate, such as a processing apparatus for performing a plasma process, is initially set up, or before or after an objective process is performed. Consequently, it is possible to reliably attain high cleanliness in a shorter time, as compared with, e.g., a case where cleaning is performed only with single plasma, such as oxygen plasma or nitrogen plasma, or a case where cleaning is performed while setting a process chamber opened to the atmosphere.

As a result, the process chamber for accommodating a target substrate in the substrate processing apparatus can be cleaned to an aiming cleanliness level, without lowering the operation ratio or throughput of the substrate processing apparatus.

Further, the process chamber for accommodating a target substrate can be cleaned relatively in a short time to a level necessary for a substrate process to be performed, even where the contamination degree inside the process chamber is relatively high, such as when the plasma processing apparatus is initially set up.

Furthermore, since the plasma used consists of, e.g., oxygen plasma or nitrogen plasma, high cleanliness can be obtained without causing corrosion of the interior of the process chamber due to a corrosive substance being used.

Furthermore, since the process chamber cleaning employs a plasma process with low electron temperature plasma, the interior of the process chamber can be further cleaned without causing sputtering damage to members inside the process chamber, or contamination due to re-adhesion of contaminants derived from a contamination source generated by the sputtering.

In the present invention, the plasma used in the cleaning consists preferably of low electron temperature plasma. The low electron temperature plasma means plasma having an electron temperature of about 0.5 to 3 eV. In this case, the low electron temperature plasma is preferably set to have an electron temperature of 2 eV or less. The electron temperature to be used may be defined by a mean square velocity. The electron temperature is preferably set to be 2 eV or less near the chamber inner wall. The plasma is preferably generated by microwaves supplied into the process chamber through a planar antenna having a plurality of slots. With this arrangement, it is possible to realize low electron temperature plasma, as desired.

The predetermined process performed in the processing apparatus is preferably a process with low electron temperature plasma. This process is preferably a nitriding process or oxidizing process. Further, the gas containing oxygen is preferably oxygen gas, and the gas containing nitrogen is preferably nitrogen gas.

BEST MODE FOR CARRYING OUT THE INVENTION

An embodiment of the present invention will now be described with reference to the accompanying drawings.

Figure 1:
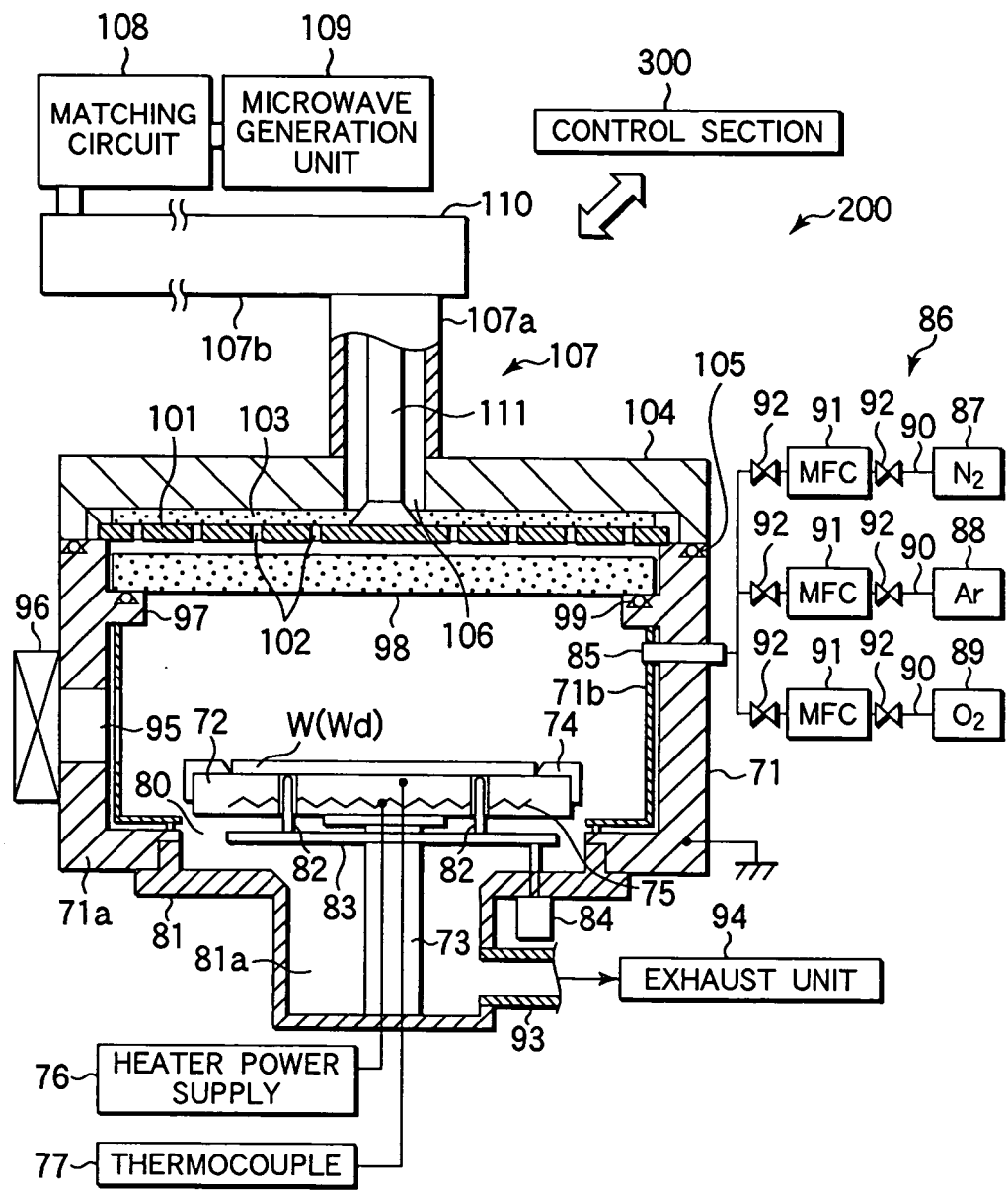
FIG. 1 is a sectional view schematically showing an example of a plasma processing apparatus to be subjected to a process chamber cleaning method according to an embodiment of the present invention.
Figure 2:
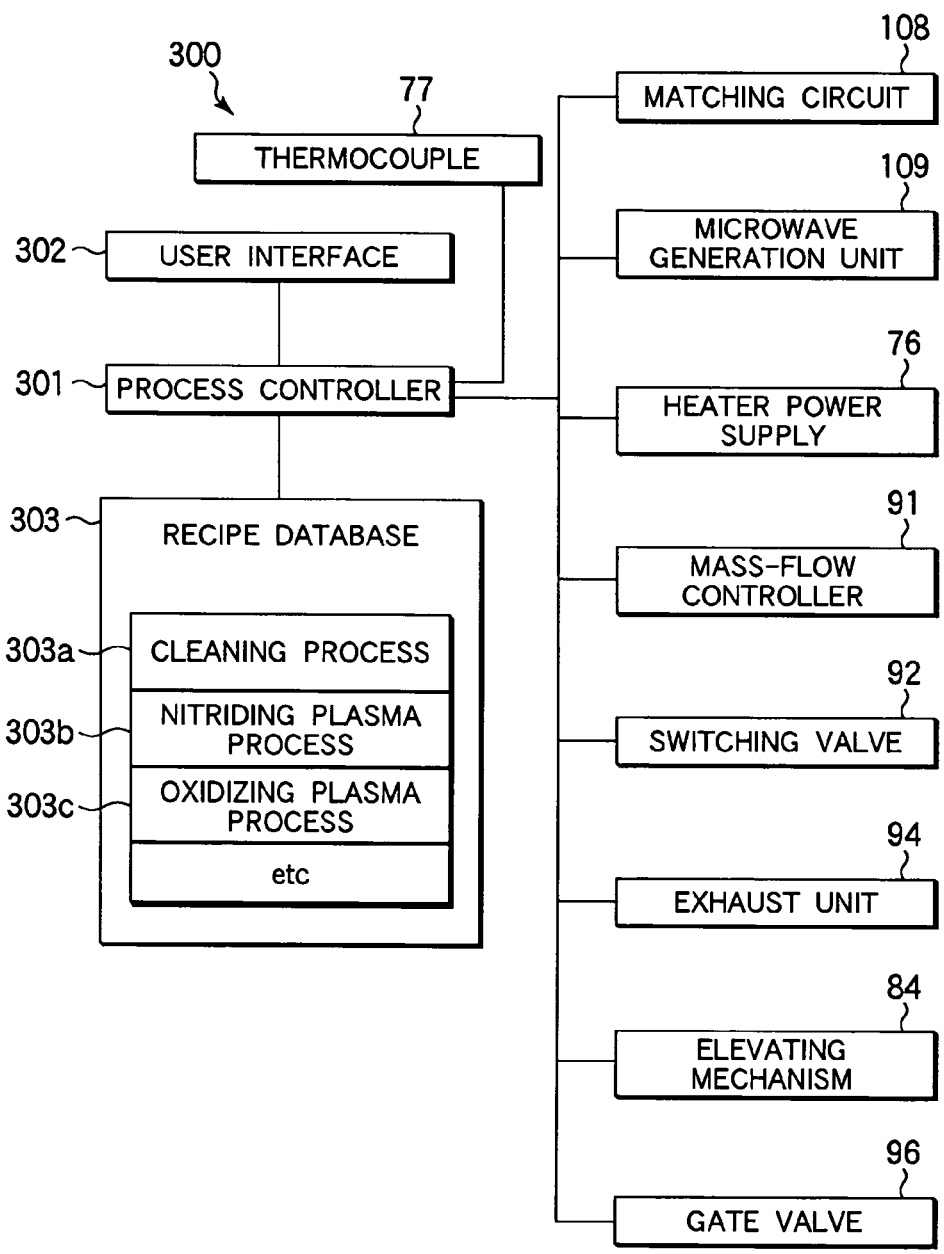
FIG. 2 is a block diagram showing an example of the structure of a control section used in the plasma processing apparatus according to the embodiment of the present invention.
Figure 3:
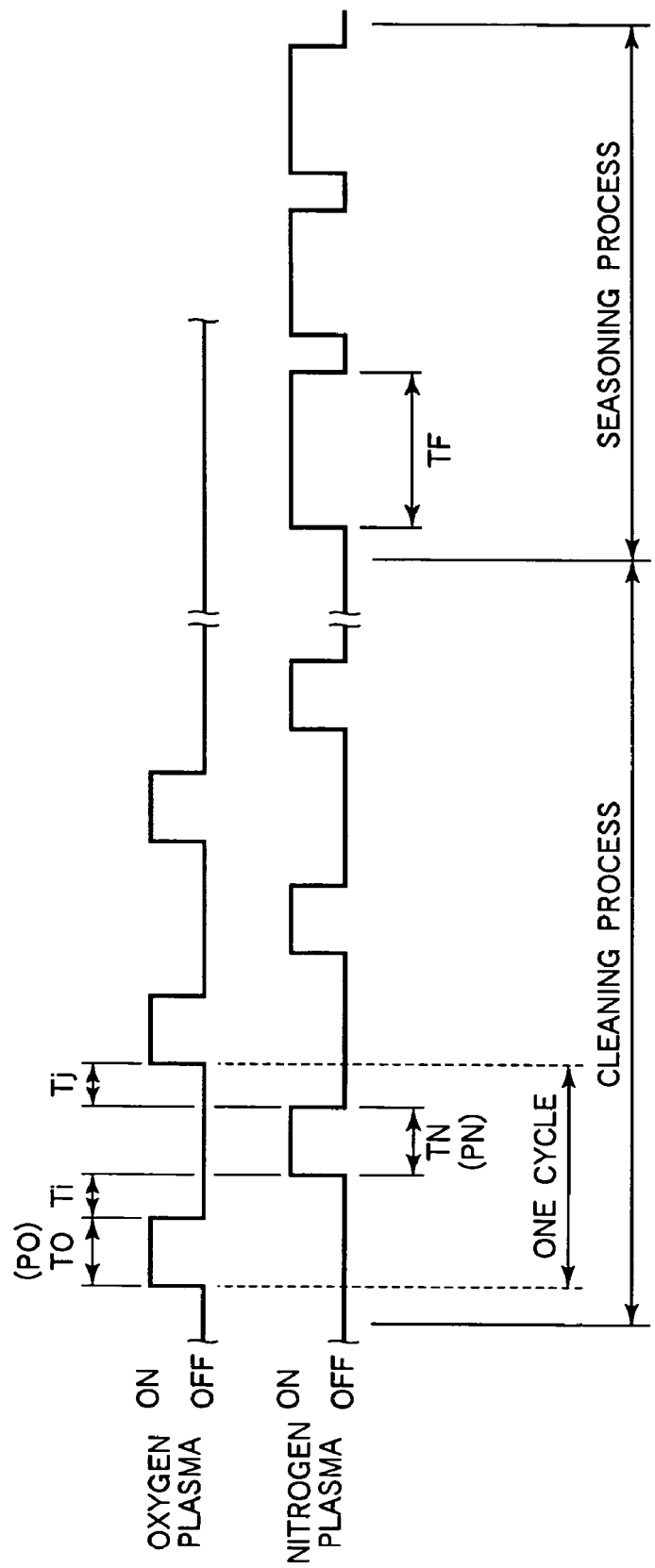
FIG. 3 is a timing chart showing an example of a process chamber cleaning method according to the embodiment of the present invention.
Figure 4:
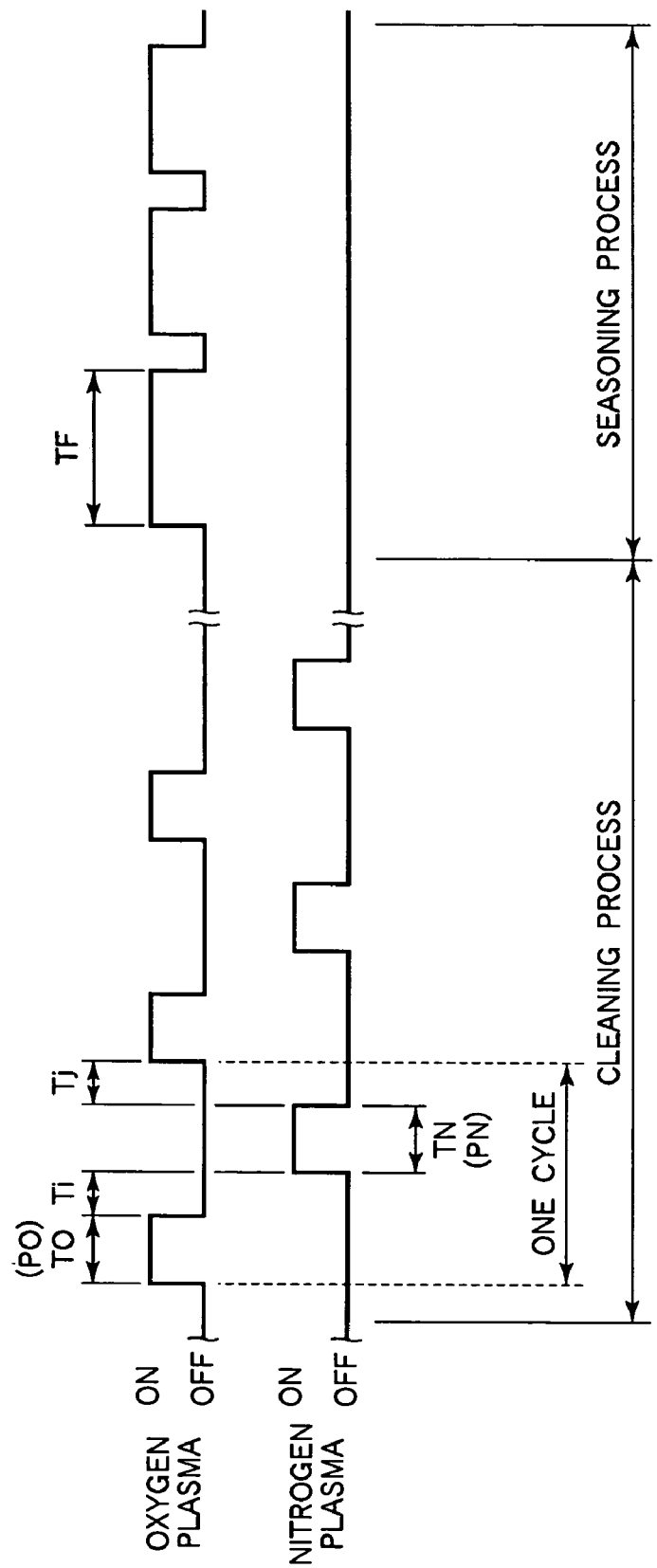
FIG. 4 is a timing chart showing another example of a process chamber cleaning method according to the embodiment of the present invention.

FIG. 1 is a sectional view schematically showing an example of a plasma processing apparatus to be subjected to a process chamber cleaning method according to an embodiment of the present invention. FIG. 2 is a block diagram showing an example of the structure of a control section used in the plasma processing apparatus according to this embodiment. FIG. 3 is a timing chart showing an example of a process chamber cleaning method according to this embodiment. FIG. 4 is a timing chart showing another example of a process chamber cleaning method according to this embodiment.

This plasma processing apparatus 200 is arranged to perform a process, such as a nitriding process or oxidizing process, using microwave plasma. The apparatus 200 includes a substantially cylindrical chamber 71, which is airtight and grounded. The bottom wall 71a of the chamber 71 has a circular opening 80 formed at the center, and is provided with an exhaust chamber 81 communicating with the opening 80 and extending downward. The chamber 71 is provided with a susceptor 72 disposed therein and made of a ceramic, such as AlN, for supporting a target substrate, such as a wafer W or dummy wafer Wd, in a horizontal state. The susceptor 72 is supported by a cylindrical support member 73 extending upward from the center of the bottom of the exhaust chamber 81. The susceptor 72 is provided with a guide ring 74 disposed on the outer edge to guide the wafer W. The susceptor 72 is further provided with a heater 75 of the resistance heating type embedded therein. The heater 75 is supplied with a power from a heater power supply 76 to heat the susceptor 72, thereby heating the target object or wafer W. The heater power supply 76 is controlled by a process controller 301 described later, with reference to signals of a thermocouple 77 used as a temperature sensor, to set the heater 75 at a predetermined output.

The susceptor 72 is provided with three wafer support pins 82 (only two of them are shown) that can project and retreat relative to the surface of the susceptor 72 to support the wafer W and move it up and down. The wafer support pins 82 are fixed to a support plate 83, and are moved up and down along with the support plate 83 by an elevating mechanism 84, such as an air cylinder.

A gas feed member 85 is disposed on the sidewall of the chamber 71, and is connected to a gas supply system 86. The gas supply system 86 includes an $N_2$ gas supply source 87, an Ar gas supply source 88, and an $O_2$ gas supply source 89, from which gases are supplied through respective gas lines 90 to the gas feed member 85 and are respectively delivered from the gas feed member 85 into the chamber 71. Each of the gas lines 90 is provided with a mass-flow controller 91 and two switching valves 92 for opening closing each of the gas lines one on either side of the controller 91.

The sidewall of the exhaust chamber 81 is connected to an exhaust unit 94 including a high-speed vacuum pump through an exhaust line 93. The exhaust unit 94 can be operated to uniformly exhaust the gas from inside the chamber 71 into the space 81a of the exhaust chamber 81, and then out of the exhaust chamber 81 through the exhaust line 93. Consequently, the pressure inside the chamber 71 can be decreased at a high speed to a predetermined vacuum level.

The chamber 71 has a transfer port 95 formed in the sidewall and provided with a gate valve 96 for opening/closing the transfer port 95. The wafer W or dummy wafer Wd is transferred between the plasma processing apparatus 200 and an adjacent transfer chamber (not shown) through the transfer port 95. A reference symbol 71b denotes a quartz liner.

The top of the chamber 71 has an opening and is provided with an annular support portion 97 projecting along the periphery of the opening. A microwave transmission plate 98 is airtightly disposed on the support portion 97 through a seal member 99. The microwave transmission plate 98 is made of a dielectric material, such as quartz or a ceramic, e.g., AlN, to transmit microwaves. The interior of the chamber 71 is thus held airtight.

A circular planar antenna member 101 is disposed above the microwave transmission plate 98 to face the susceptor 72. The planar antenna member 101 is attached to the top of the sidewall of the chamber 71. The planar antenna member 101 is formed of, e.g., a copper plate or aluminum plate with the surface plated with silver or gold. The planar antenna member 101 has a plurality of microwave radiation holes 102 formed of long groove slots or circular through-holes arrayed in a predetermined pattern. A retardation member 103 having a high dielectric constant characteristic with a dielectric constant larger than that of vacuum is disposed on the top of the planar antenna member 101. The planar antenna member 101 and retardation member 103 are covered with a shield cover 104 disposed at the top of the chamber 71. A seal member 105 is interposed between the top of the chamber 71 and the shield cover 104 to seal this portion. The shield cover 104 is provided with cooling water passages (not shown) formed therein to cool the shield cover 104 and retardation member 103 by a cooling water flowing therethrough. The shield cover 104 is grounded. The planar antenna member 101 is separated from the microwave transmission plate 98 in FIG. 1, but they may be in contact with each other.

The shield cover 104 has an opening 106 formed at the center of the upper wall and connected to a waveguide 107. The waveguide 107 is connected to a microwave generation unit 109 at one end through a matching circuit 108. The microwave generation unit 109 generates microwaves with a frequency of, e.g., 2.45 GHz, which are transmitted through the waveguide 107 to the planar antenna member 101. The microwaves may have a frequency of 8.35 GHz or 1.98 GHz.

The waveguide 107 includes a coaxial waveguide 107a having a circular cross-section and extending upward from the opening 106 of the shield cover 104, and a rectangular waveguide 107b having a rectangular cross-section, connected to the upper end of the coaxial waveguide 107a, and extending in a horizontal direction. The rectangular waveguide 107b has a mode transducer 110 at the end connected to the coaxial waveguide 107a. The coaxial waveguide 107a includes an inner conductive member 111 extending at the center, which is connected and fixed to the center of the planar antenna member 101 at the lower end.

The respective components of the plasma processing apparatus 200 are connected to a control section 300. As shown in FIG. 2, the control section 300 comprises a process controller 301, a user interface 302, and a recipe database 303.

The process controller 301 is connected to respective components, such as the heater power supply 76, elevating mechanism 84, mass-flow controller 91, switching valve 92, exhaust unit 94, gate valve 96, matching circuit 108, and microwave generation unit 109, so that the process controller 301 controls them. Further, the process controller 301 is connected to a thermocouple 77 used as a temperature sensor, so that the process controller 301 controls the heater power supply 76 with reference to signals of the thermocouple 77.

The user interface 302 includes, e.g., a keyboard and a display, wherein the keyboard is used for a process operator to input commands for operating the plasma processing apparatus 200, and the display is used for showing visualized images of the operational status of the plasma processing apparatus 200.

The recipe database 303 stores control programs for the process controller 301 to control the plasma processing apparatus 200 so as to perform various processes, and programs or recipes for respective components of the plasma processing apparatus 200 to perform processes in accordance with process conditions. Recipes may be stored in a hard disk or semiconductor memory, or stored in a portable storage medium, such as a CDROM or DVD, to be attached to a predetermined position in the recipe database 303. Further, recipes may be transmitted from another apparatus through, e.g., a dedicated line, as needed.

A required recipe is retrieved from the recipe database 303 and executed by the process controller 301 in accordance with an instruction or the like through the user interface 302. Consequently, the plasma processing apparatus 200 can perform a predetermined process under the control of the process controller 301.

In this embodiment, the recipe database 303 stores a nitriding plasma process recipe 303b for performing a nitriding process on the surface of a wafer W, using plasma of nitrogen gas supplied from the $N_2$ gas supply source 87. The recipe database 303 also stores an oxidizing plasma process recipe 303c for performing an oxidizing process on the surface of a wafer W, using plasma of oxygen gas supplied from the $O_2$ gas supply source 89. In addition, the recipe database 303 stores a cleaning process recipe 303a for performing process chamber cleaning as exemplified by the chart shown in FIG. 3.

This cleaning process recipe 303a is arranged to perform a process such that oxygen plasma PO and nitrogen plasma PN are alternately generated within the chamber 71 at least one cycle and independently of each other in an arbitrary order. Specifically, a process of generating one of the oxygen plasma PO and nitrogen plasma PN is first performed, and a process of generating the other of them is then performed. This alternate cycle is performed only one time, or repeated a plurality of times. This cycle is preferably repeated a plurality of times, and more preferably repeated three times or more. The cleaning process recipe 303a also includes, as needed, a seasoning process in which an oxygen plasma process or nitrogen plasma process is performed one time or repeated a plurality of times.

In this case, the oxygen plasma PO employs the following conditions. Specifically, the oxygen plasma generation period TO is set to be, e.g., 10 seconds to 3 minutes, and preferably 30 seconds to 100 seconds. The flow rate of $O_2$ gas is set to be 0.005 to 5.0 L/minute. The flow rate of Ar gas used as a carrier gas is set to be 0.1 to 5.0 L/minute. The pressure inside the chamber 71 is set to be 6 to 633 Pa.

On the other hand, the nitrogen plasma PN employs the following conditions. Specifically, the nitrogen plasma generation period TN is set to be, e.g., 10 seconds to 3 minutes, and preferably 30 seconds to 100 seconds. The flow rate of $N_2$ gas is set to be 0.05 to 1.0 L/minute. The flow rate of Ar gas used as a carrier gas is set to be 0.1 to 3.0 L/minute. The pressure inside the chamber 71 is set to be 60 to 150 Pa.

The cycle-middle recess period Ti between the oxygen plasma generation period TO and nitrogen plasma generation period TN is set to be, e.g., 20 to 40 seconds. The cycle-end recess period Tj at the end of each cycle is set to be, e.g., 20 to 40 seconds.

According to the cleaning process recipe 303a, one cycle is defined by a period from the oxygen plasma generation period TO to the cycle-end recess period Tj. For example, this cycle is repeated until the chamber 71 reaches an aiming cleanliness level.

The radio frequency power supplied from the microwave generation unit 109 to the chamber 71 is preferably set to be 500 W to 5 kW. The radio frequency power has a frequency of 2.45 GHz.

In the cleaning process, where the plasma potential of the oxygen plasma PO or nitrogen plasma PN is increased, the flow rate of oxygen gas or nitrogen gas is decreased. Where the electron temperature of the plasma is decreased, the flow rate of oxygen gas or nitrogen gas is increased.

The carrier gas used when the oxygen plasma PO or nitrogen plasma PN is generated is not limited to Ar, and it may be another inactive gas, such as Kr. The electron temperature of the plasma can be changed, depending on the carrier gas.

Next, an explanation will be given of a process operation performed in the plasma processing apparatus 200.

At first, a nitriding process will be explained as an example of a process performed in the plasma processing apparatus 200. Specifically, the gate valve 96 is opened, and a clean wafer W is loaded through the transfer port 95 into the chamber 71 and placed on the susceptor 72.

Then, $N_2$ gas and Ar gas are supplied at predetermined flow rates from the $N_2$ gas supply source 87 and Ar gas supply source 88 of the gas supply system 86 through the gas feed member 85 into the chamber 71, while the chamber 71 is maintained at a predetermined pressure.

At this time, microwaves are supplied from the microwave generation unit 109 through the matching circuit 108 into the waveguide 107. The microwaves are supplied through the rectangular waveguide 107b, mode transducer 110, and coaxial waveguide 107a in this order to the planar antenna member 101. Then, the microwaves are radiated from the planar antenna member 101 through the microwave transmission plate 98 into the space above the wafer W within the chamber 71. In this case, the wavelength of the microwaves has been shortened by the retardation member 103. The microwaves are propagated in a TE mode through the rectangular waveguide 107b. The microwaves are converted from the TE mode into a TEM mode by the mode transducer 110. The microwaves in the TEM mode are propagated through the coaxial waveguide 107a toward the planar antenna member 101.

When the microwaves are radiated from the planar antenna member 101 through the microwave transmission plate 98 into the chamber 71, $N_2$ gas and Ar gas being supplied are turned into plasma within the chamber 71 by the microwaves. With the nitrogen plasma thus generated, a nitriding process is performed on the surface of the wafer W.

The microwave plasma thus generated has a high plasma density and a low electron temperature. A process using such low electron temperature plasma has merits such that the underlayer can suffer less damage and so forth, and thus is suitably applied to a plasma process around gates. The low electron temperature plasma means plasma having an electron temperature of about 0.5 to 3 eV. In order to effectively exercise merits, such as small damage to the underlayer and so forth, the electron temperature is preferably set to be 2 eV or less. As described above, the microwave plasma can be controlled by adjusting conditions for generation to set the electron temperature to be 2 eV or less, or to be still lower with 1 eV or less. The electron temperature to be used may be defined by a mean square velocity. The electron temperature is preferably set to be 2 eV or less near the chamber inner wall.

In the plasma processing apparatus 200, an oxidizing process using oxygen plasma can be also performed on the surface of a wafer W. In this case, in place of $N_2$ gas, $O_2$ gas is supplied from the $O_2$ gas supply source 89 along with Ar gas into the chamber 71, so that a process using microwave plasma is similarly performed.

Where a process using such microwave plasma is performed, the acceptable level of contamination due to metal elements or the like within the chamber 71 is very low, and, e.g., the number of contaminant atoms has to be $2 \times 2^{10}/cm^2$ or less. If the contamination is higher, the characteristics of semiconductor devices are damaged and the yield thereof is lowered. Accordingly, very high cleanliness is required.

According to this embodiment, in order to realize such very high cleanliness, process chamber cleaning is performed, as follows.

For example, it may be necessary to remove contamination within the chamber 71, when the plasma processing apparatus 200 is initially set up, or before and after a nitriding plasma process or oxidizing plasma process is performed on each lot of wafers W. In such a case, as needed, an instruction can be input through the user interface 302 into the process controller 301 to retrieve and execute the cleaning process recipe 303a. Alternatively, a part of another recipe may be arranged to automatically retrieve and execute the cleaning process recipe 303a according to this embodiment.

When the cleaning process recipe 303a is executed in the plasma processing apparatus 200, the gate valve 96 is opened, and a clean dummy wafer Wd is loaded through the transfer port 95 into the chamber 71 and placed on the susceptor 72. This operation is performed to protect the susceptor 72 from oxygen plasma PO or nitrogen plasma PN by the dummy wafer Wd. Since this embodiment uses plasma with a low electron temperature, the dummy wafer Wd does not necessarily have to be placed on the susceptor 72.

Then, the cleaning process shown in FIG. 3 or 4 is started. At first, while the interior of the chamber 71 is maintained at a predetermined pressure of, e.g., 10 to 300 Pa, $O_2$ gas and Ar gas are supplied at flow rates of 5 to 1,000 mL/min and 0.1 to 3 L/min, respectively, from the $O_2$ gas supply source 89 and Ar gas supply source 88 of the gas supply system 86 through the gas feed member 85 into the chamber 71.

At this time, microwaves are supplied from the microwave generation unit 109 through the matching circuit 108 into the waveguide 107, as in the main plasma processes, such as the nitriding process described above. The microwaves are supplied through the rectangular waveguide 107b, mode transducer 110, and coaxial waveguide 107a in this order to the planar antenna member 101. Then, the microwaves are radiated from the planar antenna member 101 through the microwave transmission plate 98 into the space above the dummy wafer W within the chamber 71.

When the microwaves are radiated from the planar antenna member 101 through the microwave transmission plate 98 into the chamber 71, $O_2$ gas and Ar gas are turned into plasma within the chamber 71 by the microwaves, and oxygen plasma PO is thereby generated. With the oxygen plasma PO thus generated, cleaning of the interior of the chamber 71 is performed for an oxygen plasma generation period TO, using 0 radicals (O*) and so forth contained in the oxygen plasma PO. The microwave plasma thus generated is low electron temperature plasma having an electron temperature of 2 eV or less, or a still lower electron temperature of 1 eV or less, as described above.

Then, supply of $O_2$ gas and application of radio frequency power from the microwave generation unit 109 are stopped, so that the plasma is stopped for a cycle-middle recess period Ti. During this cycle-middle recess period Ti, supply of Ar used as a carrier gas is continued, so that the interior of the chamber 71 is maintained at a predetermined pressure.

Then, $N_2$ gas is supplied at a flow rate of 5 to 1,000 mL/min from the $N_2$ gas supply source 87 of the gas supply system 86 through the gas feed member 85 into the chamber 71. Further, application of the radio frequency power from the microwave generation unit 109 is restarted. When the microwaves are radiated from the planar antenna member 101 through the microwave transmission plate 98 into the chamber 71, $N_2$ gas and Ar gas are turned into plasma within the chamber 71 by the microwaves, and nitrogen plasma PN is thereby generated. With the nitrogen plasma PN thus generated, cleaning of the interior of the chamber 71 is performed for a nitrogen plasma generation period TN, using N radicals (N*) and so forth contained in the nitrogen plasma PN. The pressure inside the chamber during this nitrogen plasma step has an influence on the contamination degree. In order to lower the contamination degree, the pressure inside the chamber is preferably set to be 133.3 Pa or less, and more preferably to be 13.3 to 93.3 Pa, and furthermore preferably to be 26.6 to 66.7 Pa.

When the nitrogen plasma generation period TN has elapsed, supply of $N_2$ gas into the chamber 71 and application of radio frequency power from the microwave generation unit 109 are stopped for a cycle-end recess period Tj.

The cycle described above is repeated the necessary number of times to complete cleaning inside the chamber 71. Then, the dummy wafer Wd is unloaded from the chamber 71.

As described above, this cleaning process is performed without setting the chamber 71 opened to the atmosphere, and thus the operation ratio or throughput of the plasma processing apparatus 200 is prevented from being impaired. The cleaning process can be performed only by retrieving and executing the cleaning process recipe 303a, so that contaminants inside the chamber is removed relatively in a short time to attain very high cleanliness. Consequently, the productivity of the plasma process step is improved.

For example, when the plasma processing apparatus 200 is initially set up, the contamination degree inside the process chamber is relatively high. Further, there may be a case where a wafer W with a high contamination degree is accidentally loaded into the chamber 71. Even in such cases, the chamber 71 can be cleaned relatively in a short time to a high level necessary for a plasma process to be performed. Consequently, the yield of semiconductor devices to be formed on wafers W is improved.

Further, the cleaning process does not employ a corrosive substance, such as a fluorine compound, so the interior of the process chamber is prevented from being corroded. In addition, the cleaning process employs low electron temperature plasma, as described above, so the interior of the process chamber is prevented from suffering contamination due to sputtering or re-adhesion of contaminants. Consequently, the process chamber can be cleaned to a high level.

In this embodiment, the last cycle for performing process chamber cleaning includes a final process period TB using nitrogen plasma PN or oxygen plasma PO generated at the end, which is longer, e.g., three times or more longer, than the former nitrogen plasma generation period TN or oxygen plasma generation period TO. This arrangement makes it possible to reliably prevent a subsequent process, to be performed after the process chamber cleaning, from being affected by the oxygen plasma PO or nitrogen plasma PN alternately generated within the chamber 71 during the process chamber cleaning.

Further, in this embodiment, the plasma processing apparatus 200 can perform, as a primary plasma process function, either one of a nitriding process on a wafer W while supplying $N_2$ gas and Ar gas into the chamber 71, and an oxidizing process on a wafer W while supplying $O_2$ gas and Ar gas into the chamber 71. Accordingly, the process chamber cleaning described above can be executed before either of the nitriding process and oxidizing process is performed on a wafer W. At this time, the type of plasma generated within the chamber 71 subsequently to the process chamber cleaning is preferably set to agree with that used in the subsequent plasma process performed on a wafer W, i.e., depending on whether the subsequent process is the nitriding process or oxidizing process.

Specifically, the process chamber cleaning may be executed before the nitriding process is performed on a wafer W while supplying $N_2$ gas and Ar gas into the chamber 71. In this case, as shown in FIG. 3, after the process chamber cleaning, a final process period TB including nitrogen plasma generation and vacuum-exhaust is performed at least one cycle to execute a seasoning process. Then, the nitriding process is performed on the wafer W.

Alternatively, the process chamber cleaning may be executed before the oxidizing process is performed on a wafer W while supplying $O_2$ gas and Ar gas. In this case, as shown in FIG. 4, after the process chamber cleaning, a process period TB including oxygen plasma generation and vacuum-exhaust is performed at least one cycle to execute a seasoning process. Then, the oxidizing process is performed on the wafer W.

Consequently, the preceding process chamber cleaning is prevented from affecting the subsequent actual process on a wafer W. However, such agreement is not necessary required in some cases.

Next, an explanation will be given of a specific instance of a sequential flow of the cleaning process, seasoning process, and nitriding process. In the following explanation, numerical values are mere examples and not limiting.

At first, after a predetermined process, such as a nitriding process, is performed, Ar gas and $O_2$ gas are supplied at flow rates of 1 L/min and 0.2 L/min, respectively, into the chamber, while the pressure in the chamber is set at, e.g., 126.7 Pa. Further, the susceptor is heated to set the wafer temperature (susceptor temperature) at 400° C., so as to perform pre-heating for 30 seconds. Then, while the pressure and the flow rates of Ar gas and $O_2$ gas are maintained, microwaves are supplied at 2,000 W to ignite oxygen plasma in a high-pressure state that facilitates the ignition. Then, the process pressure is set at 66.7 Pa, and oxygen plasma PO is generated for 60 seconds. After this oxygen plasma process step is finished, the plasma is turned off, and, subsequently thereto, Ar gas and $O_2$ gas are stopped and vacuum-exhaust is performed for 30 seconds.

Then, Ar gas and $N_2$ gas are supplied at flow rates of 1 L/min and 0.15 L/min, respectively, into the chamber, while the pressure in the chamber is set at, e.g., 126.7 Pa. Further, the susceptor is heated to set the wafer temperature (susceptor temperature) at 400° C., so as to perform pre-heating for 30 seconds. Then, while the pressure and the flow rates of Ar gas and $N_2$ gas are maintained, microwaves are supplied at 1,600 W to ignite nitrogen plasma. Then, the process pressure is set at 66.7 Pa, and nitrogen plasma PN is generated for 60 seconds. After this nitrogen plasma process step is finished, the plasma is turned off, and, subsequently thereto, Ar gas and $N_2$ gas are stopped and vacuum-exhaust is performed for 30 seconds.

The cycle described above is performed at least one cycle to complete the cleaning process.

After the last plasma process step is finished and vacuum-exhaust is performed for 30 seconds, the seasoning process is executed. Where the seasoning process is followed by a nitriding process, the seasoning process is executed as follows. Specifically, Ar gas and $N_2$ gas are supplied at flow rates of 1 L/min and 0.15 L/min, respectively, into the chamber, while the pressure in the chamber is set at, e.g., 126.7 Pa. Further, the susceptor is heated to set the wafer temperature (susceptor temperature) at 400° C., so as to perform pre-heating for 30 seconds. Then, while the pressure and the flow rates of Ar gas and $N_2$ gas are maintained, microwaves are supplied at 1,600 W to ignite nitrogen plasma. Then, the process pressure is set at 66.7 Pa, and nitrogen plasma PN is generated for 180 seconds. After this nitrogen plasma process step is finished, the plasma is turned off, and, subsequently thereto, Ar gas and $N_2$ gas are stopped and vacuum-exhaust is performed. This cycle is performed a predetermined number of times to complete the seasoning, and then the nitriding process is executed as a primary process.

Next, an explanation will be given of results obtained where the cleaning process described above was actually performed.

Figure 5:
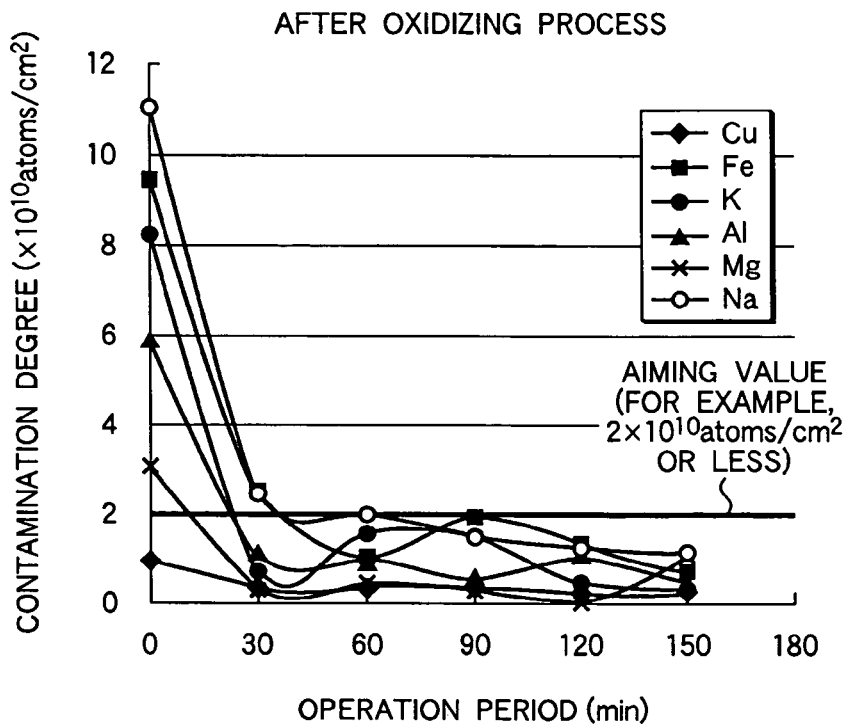
FIG. 5 is a graph showing contamination degree obtained where a process chamber cleaning method according to the present invention was actually performed.
Figure 6:
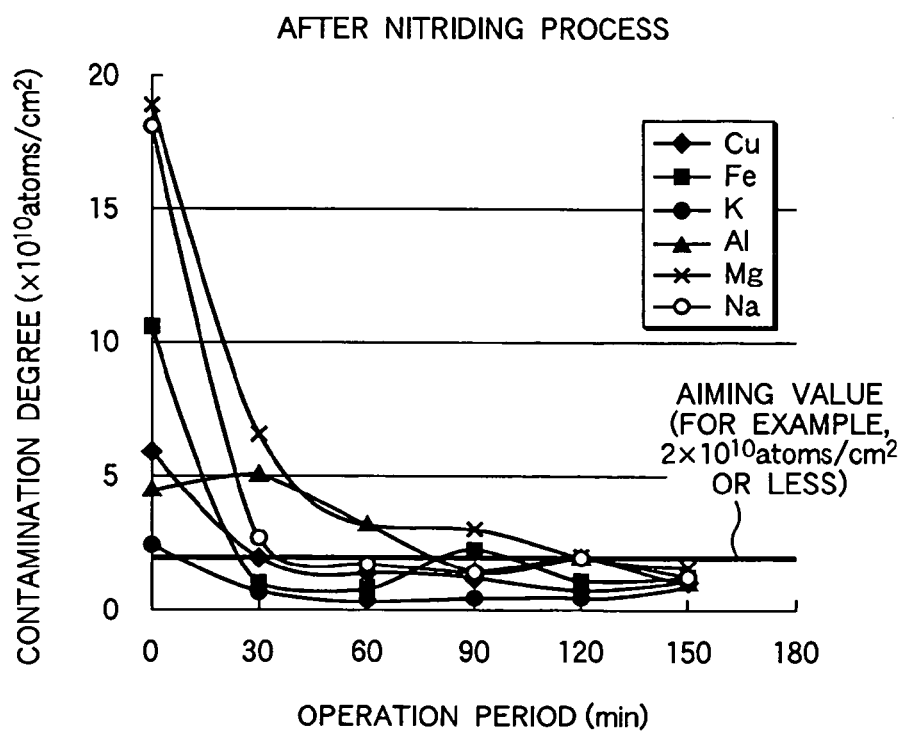
FIG. 6 is a graph showing contamination degree obtained where a process chamber cleaning method according to the present invention was actually performed.

FIGS. 5 and 6 show effects obtained where the cleaning process according to this embodiment was performed. In these drawings, the horizontal axis denotes cumulative time in the process chamber cleaning process, and the vertical axis denotes contamination degree on the surface of examination samples (the number of contaminant atoms per unit area). FIG. 5 shows results obtained by the cleaning process performed after the oxidizing process using oxygen plasma. FIG. 6 shows results obtained by the cleaning process performed after the nitriding process using nitrogen plasma.

In these experiments, the chamber was first forcibly contaminated, and a clean sample wafer was placed in the chamber. Then, the oxidizing process and nitriding process was respectively performed under predetermined conditions to prepare a contamination examination sample from the sample wafer. The examination sample thus prepared was examined by ICP-MASS (Inductive Coupled Plasma Mass Spectrometry) to measure the number of contaminant atoms per unit area (corresponding to 0 (min) in FIGS. 5 and 6).

Next, a clean sample wafer was placed in the chamber, and a cycle comprising a step of using oxygen plasma PO for one minute and a step of using nitrogen plasma PN for one minute was repeated 15 times, i.e., a cleaning operation was performed for 30 minutes in total, to prepare an examination sample from the sample wafer. The examination sample thus prepared was examined by ICP-MASS to measure the number of contaminant atoms per unit area (corresponding to 30 (min) in FIGS. 5 and 6). Next, this operation was further repeated four times, i.e., the number of times in repeating the operation was five in total, to prepare an examination sample from the sample wafer at each time the cleaning operation was finished. The examination sample thus prepared was examined by ICP-MASS to measure the number of contaminant atoms per unit area (corresponding to 60, 90, 120, and 150 (min) in FIGS. 5 and 6). In this case, Cu, Fe, K, Al, Mg, and Na were measured as contaminants.

Specific conditions used in the cleaning process were as follows:

(1) Oxygen plasma step (per unit step):
Wafer temperature (susceptor temperature): 400° C.,
Pressure: 66.7 Pa,
$O_2$ gas flow rate: 0.2 L/min,
Ar gas flow rate: 1 L/min,
Time: 30 sec, and
Microwave power: 2,000 W.

(2) Nitrogen plasma step (per unit step):
Wafer temperature (susceptor temperature): 400° C.,
Pressure: 66.7 Pa,
$N_2$ gas flow rate: 0.15 L/min,
Ar gas flow rate: 1 L/min,
Time: 60 sec, and
Microwave power: 1,600 W.

As shown in FIGS. 5 and 6, the cleanliness reached a desired value of $2 \times 10^{10}$ atoms/cm$^2$ or less in a very short time of 150 minutes, without setting the chamber 71 opened to the atmosphere, by the cleaning process according to this embodiment performed after either one of the oxidizing process and nitriding process. Accordingly, it has been confirmed that the chamber 71 can be swiftly cleaned by the process chamber cleaning to a level necessary for a plasma process to be performed on a wafer W, which severely requires a lower contamination level in recent years.

Figure 7:
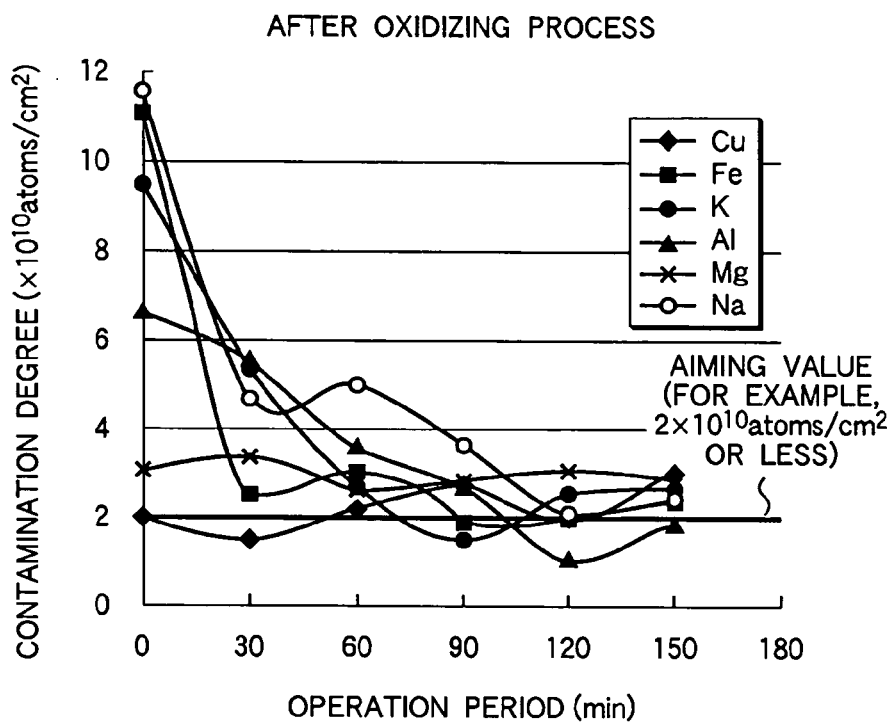
FIG. 7 is a graph showing contamination degree obtained where process chamber cleaning was performed only with nitrogen plasma, for comparison.
Figure 8:
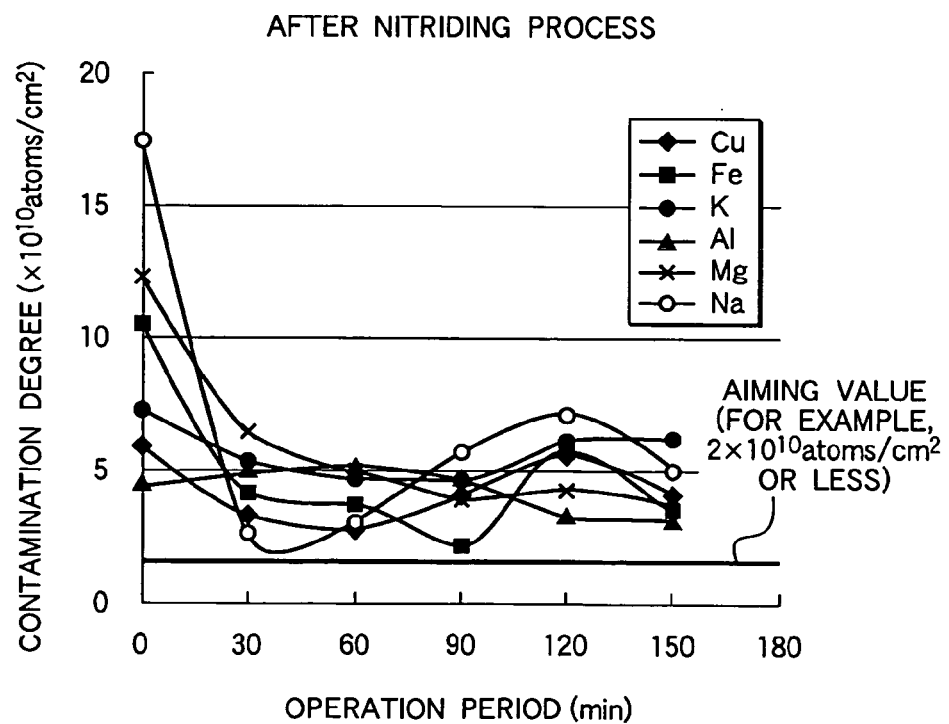
FIG. 8 is a graph showing contamination degree obtained where process chamber cleaning was performed only with nitrogen plasma, for comparison.

For comparison, FIGS. 7 and 8 show results obtained where a cleaning process was performed only with nitrogen plasma PN. In these drawings, the horizontal axis denotes cumulative time in the process chamber cleaning process, and the vertical axis denotes contamination degree on the surface of examination samples (the number of contaminant atoms per unit area). FIG. 7 shows results obtained by the cleaning process performed after the interior of the chamber was forcibly contaminated and then the oxidizing process using oxygen plasma was performed. FIG. 8 shows results obtained by the cleaning process performed after the interior of the chamber was forcibly contaminated and then the nitriding process using nitrogen plasma was performed. Also in this case, Cu, Fe, K, Al, Mg, and Na were measured as contaminants.

In the comparative experiments, a cleaning operation for 30 minutes only with nitrogen plasma PN was repeated five times in total to prepare an examination sample, as in FIGS. 5 and 6 described above. As a result, as shown in FIGS. 7 and 8, it was confirmed that, where a cleaning process was performed by repeating nitrogen plasma PN alone, the cleanliness did not reach a desired value of $2\times10^{10}$ atoms/cm$^2$ or less in 150 minutes, in either case after the oxidizing process was performed or the nitriding process was performed.

Next, experiments were conducted to perform a cleaning process with different values of the pressure in the nitrogen plasma step. In these experiments, a nitriding process was performed under conditions set forth below. Then, when the cleaning process was performed, the pressure in the nitrogen plasma was set at different values of 126.7 Pa and 66.7 Pa. Conditions used at this time were as follows:

(1) Nitriding process:
Pressure: 6.7 Pa,
N$_2$ gas flow rate: 40 mL/min,
Ar gas flow rate: 1 L/min,
Time: 20 sec, and
Microwave power: 1,500 W.
(2) Cleaning process:
(i) Oxygen plasma process (per unit step):
Pressure: 66.7 Pa,
O$_2$ gas flow rate: 0.2 L/min,
Ar gas flow rate: 1 L/min,
Time: 30 sec, and
Microwave power: 2,000 W.
(ii) Nitrogen plasma process (per unit step):
Pressure: 126.7 Pa or 66.7 Pa,
N$_2$ gas flow rate: 0.15 L/min,
Ar gas flow rate: 1 L/min,
Time: 60 sec, and
Microwave power: 1,600 W.

Figure 9A:
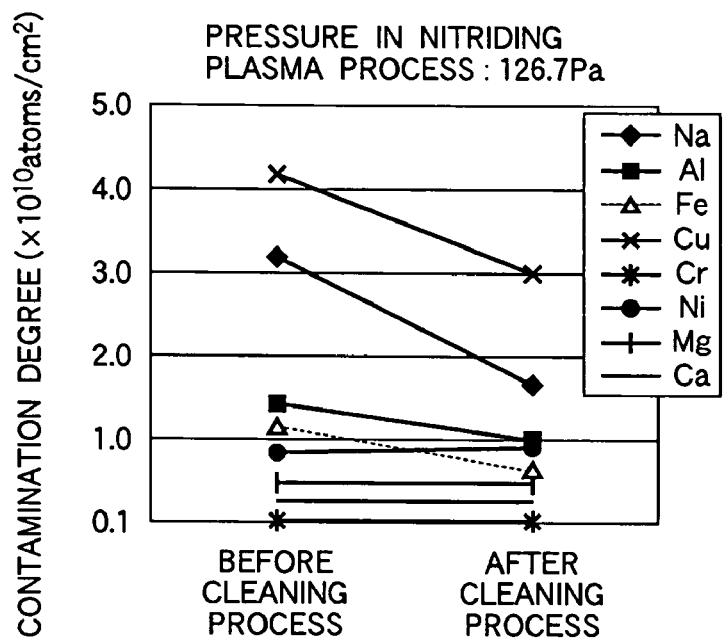
FIG. 9A is a graph showing contamination degree obtained before and after a cleaning process where a process chamber cleaning method according to the present invention was actually performed with a nitrogen plasma process set at a pressure of 126.7 Pa.
Figure 9B:
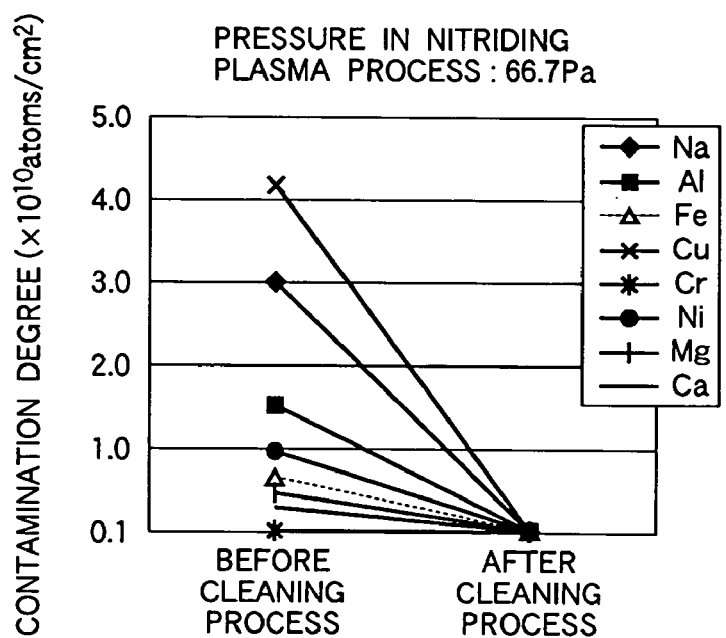
FIG. 9B is a graph showing contamination degree obtained before and after a cleaning process where a process chamber cleaning method according to the present invention was actually performed with a nitrogen plasma process set at a pressure of 66.7 Pa.

The cleaning process was performed by repeating the oxygen plasma step and nitrogen plasma step described above 15 times. Before and after the cleaning process, a contamination examination sample was prepared from the sample wafer by nitriding process plasma. The examination sample thus prepared, before and after the cleaning process, was examined by ICP-MASS to measure the contamination degree (the number of contaminant atoms per unit area) in terms of Na, Al, Fe, Cu, Cr, Ni, Mg, and Ca. FIGS. 9A and 9B show results of the experiments. As regards FIG. 9A, Cr was not higher than the detection limit both before and after the cleaning process. As regards FIG. 9B, Cr was not higher than the detection limit before the cleaning process, and Na, Fe, Cu, Cr, Ni, and Mg were not higher than the detection limit after the cleaning process.

As shown in FIGS. 9A and 9B, it was confirmed that the effect of the cleaning process was enhanced when the pressure of the nitrogen plasma step was set at 66.7 Pa than at 126.7 Pa.

The present invention is not limited to the embodiment described above, and it may be modified in various manners. For example, in the embodiment described above, the cleaning process is arranged to first perform the oxygen plasma process, but it can be arranged to first perform either the oxygen plasma process or nitrogen plasma process. Further, in the embodiment described above, the cleaning process is arranged to alternately supply O$_2$ gas and N$_2$ gas into the chamber 71 to generate plasma. However, this is not limiting, and the cleaning process may be differently applied as long as a gas containing oxygen and a gas containing nitrogen are used. Examples of such gases are NO, NO$_2$, and NH$_3$.

The processing apparatus to be subjected to a process chamber cleaning method according to the present invention is exemplified by a processing apparatus of the low electron temperature plasma type, in which microwaves are transmitted into a chamber through a planar antenna having a plurality of slots to generate plasma. In this respect, microwaves may be transmitted through an antenna of anther type, or may be transmitted into a process chamber without an antenna. In general, low electron temperature plasma is generated by used of microwaves. However, even where RF plasma of the inductive coupling type or parallel-plate type is used, low electron temperature plasma can be generated by supplying pulsed RF. Accordingly, plasma of another type may be used, as long as the plasma is applicable to a process chamber cleaning process according to the present invention. Similarly, it is also possible to use RF plasma of the magnetron type proposed in recent years to generate low electron temperature plasma. Further, in the embodiment described above, as a typical example, the plasma source of a processing apparatus is used to perform a cleaning process. However, a processing apparatus may be provided with a plasma source for a cleaning process, other than a plasma source for a substrate process. In this case, the substrate processing apparatus may be arranged to perform a non-plasma process.

The invention claimed is:

1. A substrate processing method for performing a nitriding process on a target substrate accommodated in a process chamber, the method comprising:
performing a cleaning cycle a plurality of times within the process chamber in which the target substrate is not present, wherein the cleaning cycle includes, in an alternating manner, a first period of cleaning the process chamber by supplying a first mixture gas consisting of oxygen gas and argon gas into the process chamber and generating first plasma of the first mixture gas, and a second period of cleaning the process chamber by supplying a second mixture gas consisting of nitrogen gas and argon gas into the process chamber and generating second plasma of the second mixture gas;
after the performing, seasoning the process chamber in which the target substrate is not present by supplying the second mixture gas into the process chamber and generating plasma of the second mixture gas; and
after the seasoning, loading the target substrate into the process chamber and performing the nitriding process on the target substrate,
wherein the substrate processing method comprises no period of cleaning the process chamber by use of a fluorine-containing compound inside the cleaning cycle or between the cleaning cycle and the nitriding process.

2. The substrate processing method according to claim 1, wherein each of the first plasma and the second plasma is set to have an electron temperature of 2 eV or less.

3. The substrate processing method according to claim 1, wherein each of the first plasma and the second plasma is low electron temperature plasma generated by microwaves supplied into the process chamber through a planar antenna having a plurality of slots and disposed on the process chamber to face the target substrate.

4. The substrate processing method according to claim 1, wherein the cleaning cycle and the seasoning are performed while a dummy substrate is placed on a table for placing the target substrate, so as to protect the table.

5. The substrate processing method according to claim 1, wherein the seasoning comprises a plasma generation time longer than a generation time of the first plasma or the second plasma of the cleaning cycle.

6. The substrate processing method according to claim 1, wherein the cleaning cycle comprises performing vacuum-exhaust of the process chamber and introducing argon gas into the process chamber between the generating the first plasma and the generating the second plasma.

7. The substrate processing method according to claim 1, wherein the first mixture gas is set such that the oxygen gas is supplied at a flow rate smaller than a flow rate of the argon gas of the first mixture gas and the second mixture gas is set such that the nitrogen gas is supplied at a flow rate smaller than a flow rate of the argon gas of the second gas mixture.

8. A substrate processing method for performing an oxidizing process on a target substrate accommodated in a process chamber, the substrate processing method comprising:
performing a cleaning cycle a plurality of times within the process chamber in which the target substrate is not present, wherein the cleaning cycle includes, in an alternating manner, a first period of cleaning the process chamber by supplying a first mixture gas consisting of oxygen gas and argon gas into the process chamber and generating first plasma of the first mixture gas, and a second period of cleaning the process chamber by supplying a second mixture gas consisting of nitrogen gas and argon gas into the process chamber and generating second plasma of the second mixture gas;
after the performing, seasoning the process chamber in which the target substrate is not present by supplying the first mixture gas into the process chamber and generating plasma of the first mixture gas; and
after the seasoning, loading the target substrate into the process chamber and performing the oxidizing process on the target substrate,
wherein the substrate processing method comprises no period of cleaning the process chamber by use of a fluorine-containing compound inside the cleaning cycle or between the cleaning cycle and the oxidizing process.

9. The substrate processing method according to claim 8, wherein each of the first plasma and the second plasma is set to have an electron temperature of 2 eV or less.

10. The substrate processing method according to claim 8, wherein each of the first plasma and the second plasma is low electron temperature plasma generated by microwaves supplied into the process chamber through a planar antenna having a plurality of slots and disposed on the process chamber to face the target substrate.

11. The substrate processing method according to claim 8, wherein the cleaning cycle and the seasoning are performed while a dummy substrate is placed on a table for placing the target substrate, so as to protect the table.

12. The substrate processing method according to claim 8, wherein the seasoning comprises a plasma generation time longer than a generation time of the first plasma or the second plasma of the cleaning cycle.

13. The substrate processing method according to claim 8, wherein the cleaning cycle comprises performing vacuum-exhaust of the process chamber and introducing argon gas into the process chamber between the generating the first plasma and the generating the second plasma.

14. The substrate processing method according to claim 8, wherein the first mixture gas is set such that the oxygen gas is supplied at a flow rate smaller than a flow rate of the argon gas of the first mixture gas and the second mixture gas is set such that the nitrogen gas is supplied at a flow rate smaller than a flow rate of the argon gas of the second gas mixture.

* * * * *